United States Patent
Bilski et al.

(10) Patent No.: US 7,181,718 B1
(45) Date of Patent: Feb. 20, 2007

(54) STRUCTURES AND METHODS PROVIDING COLUMNS OF TIGHTLY COUPLED PROCESSOR AND RAM BLOCKS WITHIN AN ARRAY OF LOGIC BLOCKS

(75) Inventors: Goran Bilski, Molndal (SE); Ralph D. Wittig, Menlo Park, CA (US); Jennifer Wong, Fremont, CA (US); David B. Squires, Palo Alto, CA (US)

(73) Assignee: Xilinx, Inc., San Jose, CA (US)

( * ) Notice: Subject to any disclaimer, the term of this patent is extended or adjusted under 35 U.S.C. 154(b) by 354 days.

(21) Appl. No.: 10/928,599

(22) Filed: Aug. 27, 2004

Related U.S. Application Data

(62) Division of application No. 10/386,955, filed on Mar. 11, 2003, now Pat. No. 6,803,786.

(51) Int. Cl.
*G06F 17/50* (2006.01)

(52) U.S. Cl. .............................. 716/16; 716/10; 716/17

(58) Field of Classification Search .................. 716/16, 716/17; 326/41
See application file for complete search history.

(56) References Cited

U.S. PATENT DOCUMENTS

| | | | |
|---|---|---|---|
| 5,835,747 A | 11/1998 | Trull | |
| 6,038,657 A | 3/2000 | Favor et al. | |
| 6,145,020 A | 11/2000 | Barnett | |
| 6,191,614 B1 | 2/2001 | Schultz et al. | |
| 6,255,849 B1 * | 7/2001 | Mohan | 326/41 |
| 6,429,682 B1 * | 8/2002 | Schultz et al. | 326/41 |
| 6,522,167 B1 | 2/2003 | Ansari et al. | |
| 6,662,285 B1 | 12/2003 | Douglass et al. | |
| 6,803,786 B1 * | 10/2004 | Bilski et al. | 326/41 |
| 6,897,676 B1 * | 5/2005 | Pang | 326/38 |
| 6,946,874 B1 * | 9/2005 | Bilski et al. | 326/41 |

OTHER PUBLICATIONS

U.S. Appl. No. 09/968,446, Sep. 28, 2001, Douglass et al.
Xilinx, Inc.; "Virtex-II Pro Platform FPGA Handbook"; published Oct. 14, 2002; available from Xilnix, Inc., 2100 Logic Drive, San Jose, California 95124; pp. 19-71.
Xilinx, Inc.; "Virtex-II Pro Platform FPGA Handbook"; published Dec. 2000; available from Xilinx, Inc., 2100 Logic Drive, San Jose, California 95124; pp. 33-75.

* cited by examiner

*Primary Examiner*—Paul Dinh
*Assistant Examiner*—Suchin Parihar
(74) *Attorney, Agent, or Firm*—Lois D. Cartier

(57) ABSTRACT

Structures and methods of including processor capabilities in an existing PLD architecture with minimal disruption to the existing general interconnect structure. In a PLD including a column of block RAM (BRAM) blocks, the BRAM blocks are modified to create specialized logic blocks including a RAM, a processor, and a dedicated interface coupled between the RAM, the processor, and the general interconnect structure of the PLD. The additional area is obtained by increasing the width of the column of BRAM blocks. Because the interconnect structure remains virtually unchanged, the interconnections between the specialized logic blocks and the adjacent tiles are already in place, and the modifications do not affect the PLD routing software. In some embodiments, the processor can be optionally disabled, becoming transparent to the user. Other embodiments provide methods of modifying a PLD to include the structures and provide the capabilities described above.

29 Claims, 10 Drawing Sheets

STRUCTURES AND METHODS PROVIDING COLUMNS OF TIGHTLY COUPLED PROCESSOR AND RAM BLOCKS WITHIN AN ARRAY OF LOGIC BLOCKS

FIELD OF THE INVENTION

The invention relates to programmable logic devices (PLDs) including specialized logic blocks. More particularly, the invention relates to structures and methods for including processor capabilities in RAM blocks in an existing PLD architecture with minimal disruption to the existing general interconnect structure.

BACKGROUND OF THE INVENTION

Programmable logic devices (PLDs) are a well-known type of digital integrated circuit that can be programmed to perform specified logic functions. One type of PLD, the field programmable gate array (FPGA), typically includes an array of configurable logic blocks (CLBs) and programmable input/output blocks (IOBs). The CLBs and IOBs are interconnected by a programmable general interconnect structure.

The interconnect structure and logic blocks are typically programmed by loading a stream of configuration data (bitstream) into internal configuration memory cells that define how the logic blocks and interconnect are configured. The configuration data can be read from memory (e.g., an external PROM) or written into the FPGA by an external device. The collective states of the individual memory cells then determine the function of the FPGA.

Some FPGAs include blocks of dedicated logic in the CLB array. "Dedicated logic" is hard-coded logic designed to perform a specific function, although the dedicated logic can be programmable to modify the function. For example, the Xilinx Virtex®-II FPGA includes blocks of Random Access Memory (BRAM), as shown in FIG. 1. The Xilinx Virtex-II FPGA is described in detail in pages 33–75 of the "Virtex-II Platform FPGA Handbook", published December, 2000, available from Xilinx, Inc., 2100 Logic Drive, San Jose, Calif. 95124, which pages are incorporated herein by reference.

As shown in FIG. 1, in the Virtex-II FPGA the array of logic blocks and programmable general interconnect is designed as an array of "tiles". The tile approach both facilitates the physical implementation of the programmable interconnect structure and makes feasible the routing software that implements a user design in the FPGA. One tile can include, for example, a CLB 104, which includes a block of logic (configurable logic element or CLE 101a). Each CLB includes an interconnect area 105 in addition to the CLE 101, and in fact interconnect area 105 typically consumes a much larger percentage of the available area than CLE 101.

As is well known in the art, interconnect area 105 includes a hierarchy of interconnect lines and several switch matrices for programmably coupling the interconnect lines to each other and to input and output ports of the CLE. Thus, interconnect area 105 constitutes a portion of the programmable general interconnect structure of the FPGA.

In the Virtex-II FPGA, each BRAM block 106 consumes more than one tile in the CLB array, as shown in FIG. 1. The RAM logic 103 is surrounded by programmable interconnect 107, e.g., similar to interconnect 105 in CLB 104. As in CLB 104, the interconnect area of the BRAM block consumes a significant amount of the surface area available for the block.

The tiles devoted to implementing specialized functions are often arranged in columns, as shown in FIG. 1, to simplify the routing of user designs. Another advantage of placing the specialized blocks in separate columns is that the specialized tiles can be of a different width from the CLB tiles. When a columnar arrangement is used, the height of each specialized block is the same as, or a multiple of, the height of one CLB tile.

In the Virtex-II FPGA, more than one column of CLBs typically separates each column of BRAM blocks, as shown on page 60 of the Virtex-II Platform FPGA Handbook, referenced above. In FIG. 1, only one column of CLBs is shown between each column of BRAM blocks, to clarify the figure.

More advanced FPGAs can include more complicated logic blocks in the CLB array. For example, the Xilinx Virtex-II Pro™ FPGA includes embedded processor blocks in addition to the blocks available in the Virtex-II FPGA. The Xilinx Virtex-II Pro FPGA is described in detail in pages 19–71 of the "Virtex-II Pro Platform FPGA Handbook", published Oct. 14, 2002 and available from Xilinx, Inc., which pages are incorporated herein by reference.

FIG. 2 shows how the processor blocks are embedded in the Virtex-II Pro CLB array. In essence, the BRAM blocks illustrated in FIG. 1 are spread apart vertically to provide room for additional tile rows that include the processor blocks. (In the Virtex-II Pro CLB arrays, a processor block typically covers many more tiles than are shown in FIG. 2, both vertically and horizontally. The number of tiles has been reduced in the figure, for clarity.) Each processor block includes a processor (uP 211), two on-chip memory control blocks (OCMs 212a, 212b), and programmable interconnect 213. The processor and the OCMs are tightly coupled together, i.e., they are interconnected by a dedicated interface rather than being coupled together using the programmable interconnect structure of the FPGA. Additionally, the OCMs provide dedicated interfaces between the processor 211 and the adjacent BRAM blocks 103a–103d.

The OCMs serve two main purposes. Firstly, and most obviously, the OCMs function to adapt the defined interface required by the processor 211 to the needs of the BRAM blocks. For example, the OCMs perform address decoding functions. Additionally, however, the interface between the processor 211 and RAM logic 103 might not be able to function at the same maximum frequency as the processor itself. By operating the OCM blocks at a slower clock frequency than the processor, the processor is freed from having to accommodate this external frequency limitation.

However, there are many applications where it is desirable to operate an electronic system at the highest possible clock frequency. Many of these systems can also benefit from the advantages of reprogrammability. Therefore, it is desirable to provide programmable logic devices (PLDs) incorporating processor functionality wherein the memory access speed of the embedded processors is not limited by timing delays built into memory control blocks.

Further, there are many applications that can benefit from the availability of processor functionality in a PLD, but do not require the computing power provided, for example, by the powerful processors included in the Virtex-II Pro FPGA. Many PLD users would benefit from the addition of processor capability, but prefer a lower cost to a larger die size (and the consequent increase in price) including processor capability. Further, some PLD users do not need and would not use the processor capability. It is desirable to provide a PLD that can meet the needs of each of these users. Therefore, it is desirable to provide processor capability in a PLD while minimizing the increase in die size caused by the modification.

It is further desirable to minimize the disruption to the fabric of the PLD. When the processor is not used, it is desirable to have the capability of making the presence of the processor transparent to the user. Further, it is desirable to minimize the effect on the PLD routing software of modifying the PLD to include processor capability.

SUMMARY OF THE INVENTION

The invention provides structures and methods of including processor capabilities in an existing PLD architecture with minimal disruption to the existing general interconnect structure. In a PLD including a column of block RAM (BRAM) blocks, the BRAM blocks are modified to create specialized logic blocks including a RAM, a processor, and a dedicated interface coupled between the RAM, the processor, and the general interconnect structure of the PLD. The interconnect structure uses the majority of the die area within the BRAM block, and the interconnect structure is retained virtually unchanged from the BRAM block. Thus, the addition of the processor and dedicated interface causes the area of the block to increase only slightly. This additional area is obtained by increasing the width of the column of BRAM blocks, e.g., by a small fraction of one block width.

Because the interconnect structure remains virtually unchanged, the interconnections between the specialized logic blocks and the adjacent tiles are already in place, and the modifications do not affect the PLD routing software.

In some embodiments, the processor can be optionally disabled, (e.g., by setting a bit in a configuration memory cell) in which case the processor becomes transparent to the user. In other embodiments, the enable signal is a user-controlled signal, e.g., coupled to the general interconnect structure.

In some embodiments, the specialized logic blocks replace two or more BRAM blocks. In one such embodiment, a specialized logic block includes one RAM used for processor data and another RAM used for processor instructions. Thus, this specialized logic block replaces two BRAM blocks that are vertically adjacent in the column of BRAM blocks.

Because the processor is laid out in close proximity to the RAM, the interface between the two circuits can be relatively fast. Therefore, in some embodiments the dedicated interface and the processor operate at the same clock frequency.

Other embodiments of the invention provide methods of modifying a PLD including columns of BRAM blocks and columns of programmable logic blocks programmably interconnected by a general interconnect structure, to include the structures and provide the capabilities described above.

According to one embodiment, a programmable logic device (PLD) includes a plurality of programmable logic blocks arranged in an array of rows and columns, a general interconnect structure programmably interconnecting the programmable logic blocks, and a column of specialized logic blocks disposed between two columns of programmable logic blocks within the array. Each specialized logic block includes a first random access memory (RAM), a processor, and a dedicated interface coupled between the first RAM and the processor and further programmably coupled to the general interconnect structure.

According to another embodiment, a system includes a system bus, at least one peripheral device coupled to the system bus, and a PLD substantially as described above.

Another aspect of the invention provides a method of modifying a PLD including columns of BRAM blocks and columns of programmable logic blocks programmably interconnected by a general interconnect structure. Each BRAM block includes a RAM and a plurality of terminals coupling the RAM to the general interconnect structure. The method includes, for each BRAM block in a first column of BRAM blocks, widening the BRAM block to create a specialized logic block wider but having the same height as the BRAM block. The terminals of the specialized logic block have corresponding locations to the terminals of the BRAM block. The specialized logic block is then modified to include a processor and a dedicated interface coupled to the RAM from the BRAM block and to the processor, and further coupled to the general interconnect structure via the terminals of the specialized logic block.

According to another embodiment, another method is provided of modifying a PLD including columns of BRAM blocks and columns of programmable logic blocks programmably interconnected by a general interconnect structure. Each BRAM block includes a RAM and a plurality of terminals coupling the RAM to the general interconnect structure. The method includes, for each group of adjacent BRAM blocks within a column, selecting a first group of adjacent BRAM blocks within the column to create a specialized logic block, and widening the specialized logic block to be wider but to have the same height as the first group of adjacent BRAM blocks. The terminals of the specialized logic block have corresponding locations to the terminals of the first group of BRAM blocks. The specialized logic block is then modified to include a processor and a dedicated interface coupled to the RAMs from each of the first group of BRAM blocks and to the processor, and further coupled to the general interconnect structure via the terminals of the specialized logic block.

According to another embodiment, a method is provided of designing a new PLD based on an existing PLD architecture. The existing PLD architecture includes columns of BRAM blocks included in an array comprising rows and columns of programmable logic blocks programmably interconnected by a general interconnect structure. The method includes removing a column of the BRAM blocks, widening a space between two columns of programmable logic blocks adjacent to the removed column of BRAM blocks to create an enlarged area, creating a specialized logic block, and inserting in the enlarged area a column of the specialized logic blocks. Each specialized logic block includes a random access memory (RAM), a processor, a plurality of terminals, and a dedicated interface coupled between the RAM and the processor and further coupled to the general interconnect structure of the new PLD via the plurality of terminals. Each specialized logic block has a height equal to a-height of a first group of removed BRAM blocks. For each specialized logic block, the plurality of terminals has corresponding locations to corresponding terminals in the first group of removed BRAM blocks.

BRIEF DESCRIPTION OF THE DRAWINGS

The present invention is illustrated by way of example, and not by way of limitation, in the following figures.

DETAILED DESCRIPTION OF THE DRAWINGS

The present invention is applicable to a variety of programmable logic devices (PLDs). The present invention has been found to be particularly applicable and beneficial for field programmable gate arrays (FPGAs). While the present invention is not so limited, an appreciation of the present invention is presented by way of specific examples, in this instance by illustrating FPGAs comprising tiled arrays of logic blocks.

Figure 1:
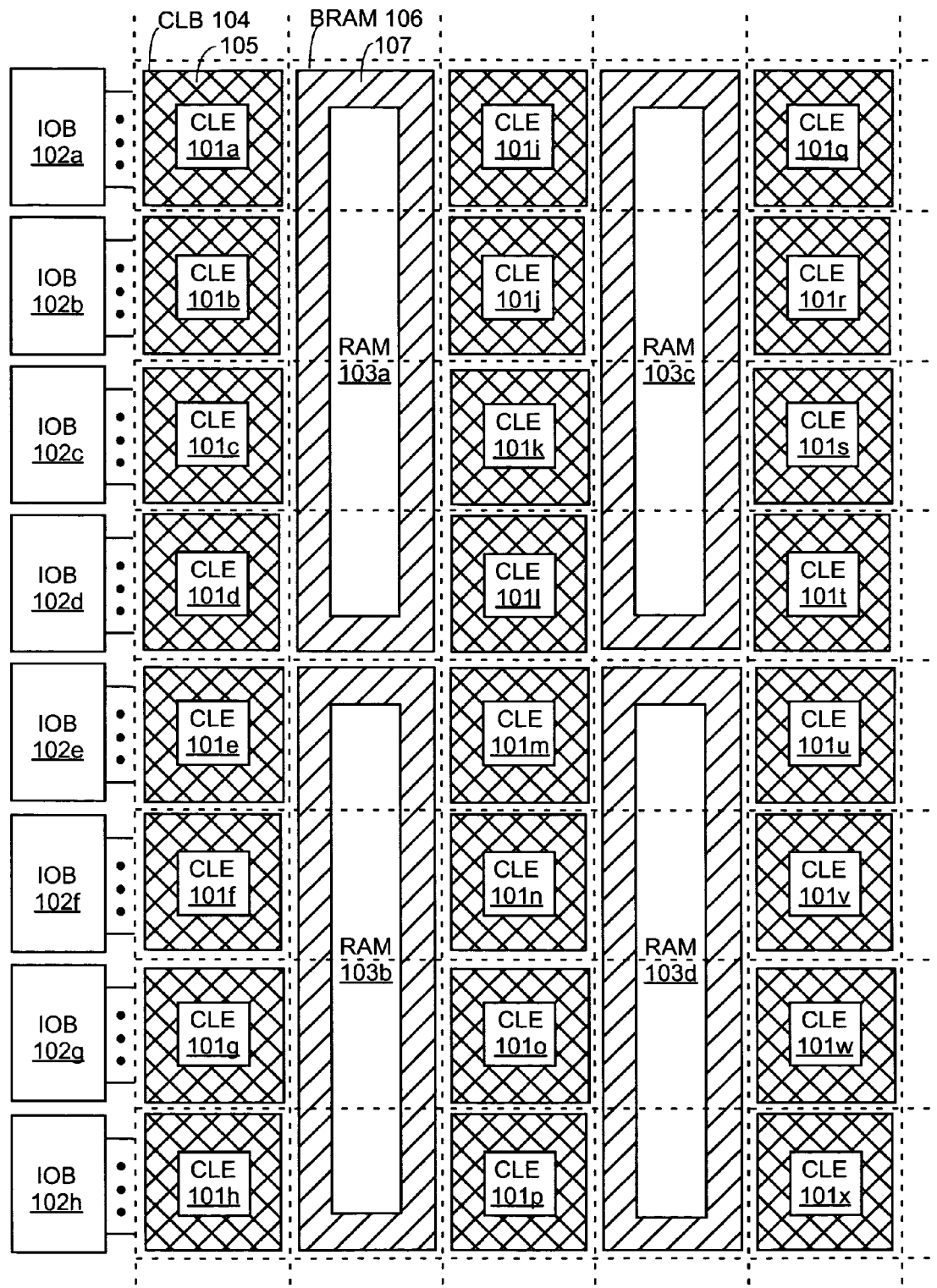
FIG. 1 is a block diagram of an FPGA similar to the Virtex-II FPGA and incorporating specialized BRAM blocks.
Figure 2:
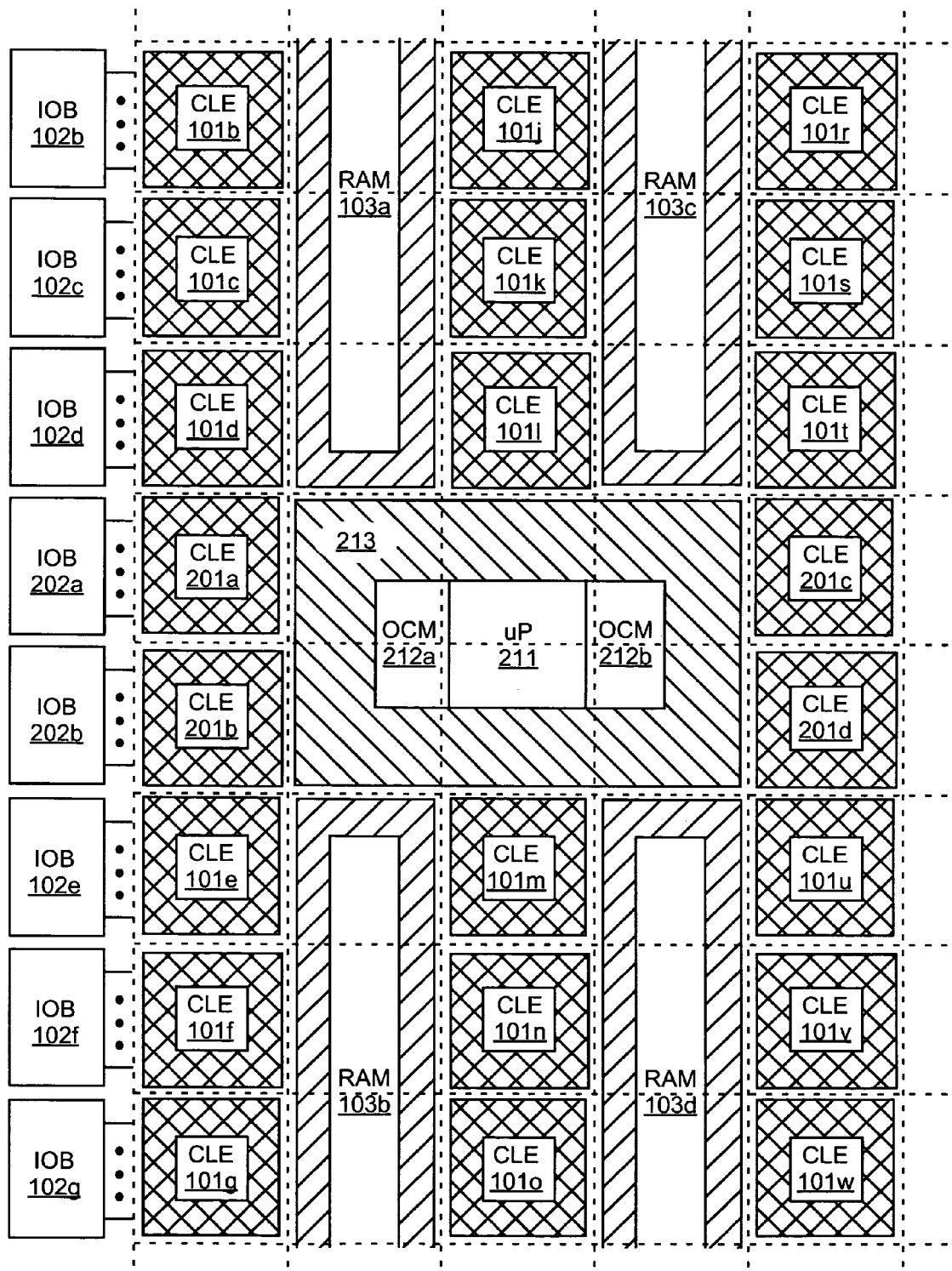
FIG. 2 is a block diagram of an FPGA similar to the Virtex-II Pro FPGA and incorporating specialized processor blocks and BRAM blocks.

As described above, FIG. 1 illustrates a known FPGA including BRAM blocks, while FIG. 2 illustrates a known FPGA that includes processor blocks in addition to the BRAM blocks.

Figure 3:
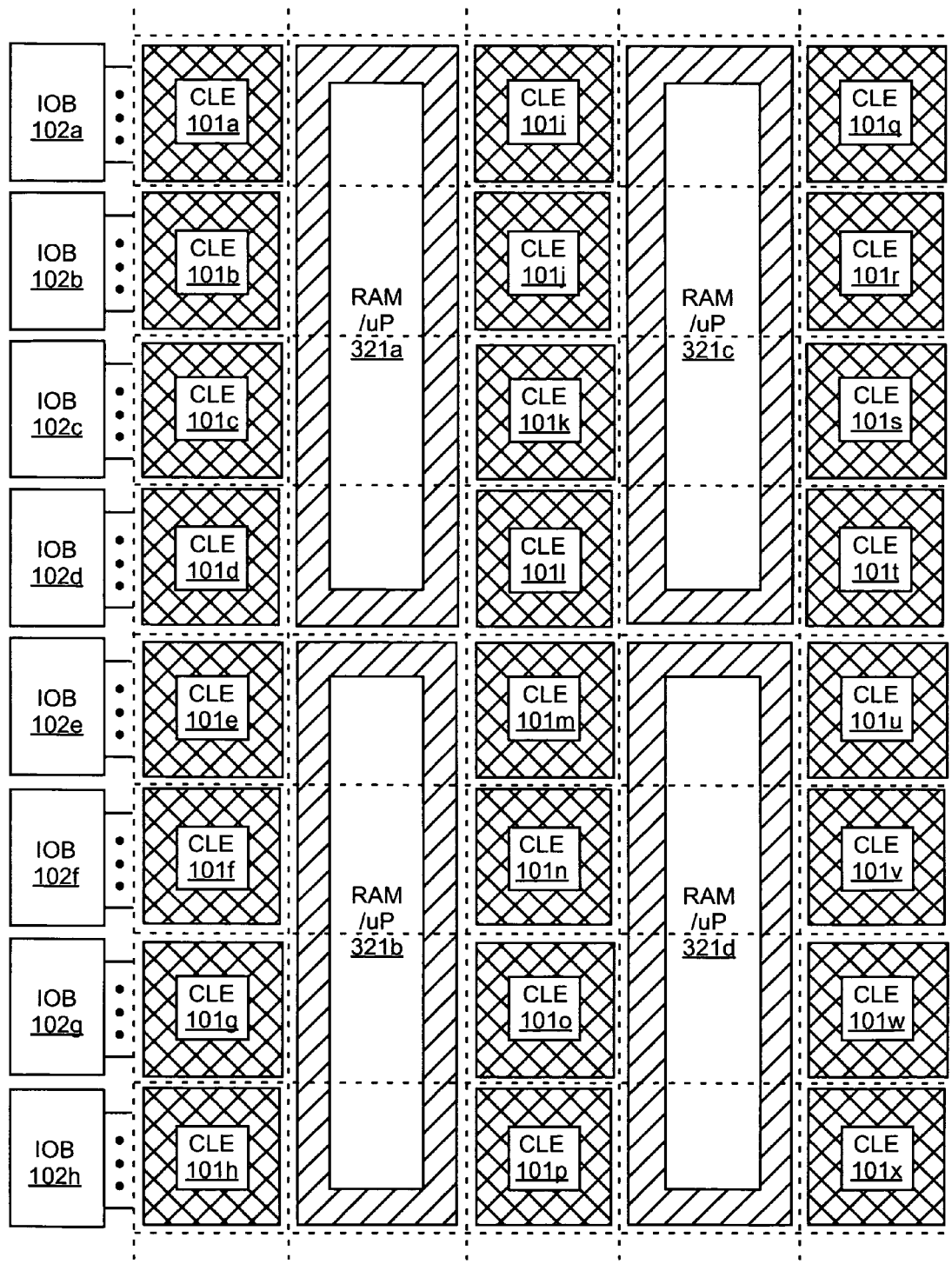
FIG. 3 is a block diagram of a first FPGA incorporating specialized blocks that offer both processor and RAM capabilities, according to one embodiment of the invention.

FIG. 3 shows a different approach to incorporating processor and RAM functions into an FPGA architecture, according to one aspect of the invention. The FPGA of FIG. 3 includes specialized logic blocks 321 offering both processor and RAM capabilities. The specialized logic blocks are substituted for BRAM blocks present in an existing PLD architecture. The terminals coupling each BRAM block to the surrounding logic blocks are retained, as is the general interconnect structure in the BRAM block. Thus, the routing software for the existing PLD architecture can still be used for the new PLD with little or no modification. Further, the processor and RAM portions of the specialized blocks are tightly coupled, lying closely together and being interconnected by dedicated interface logic. Thus, in some embodiments of the invention the dedicated interface allows memory accesses by the processor to take place at the same clock frequency as the internal processor functions.

Figure 4:
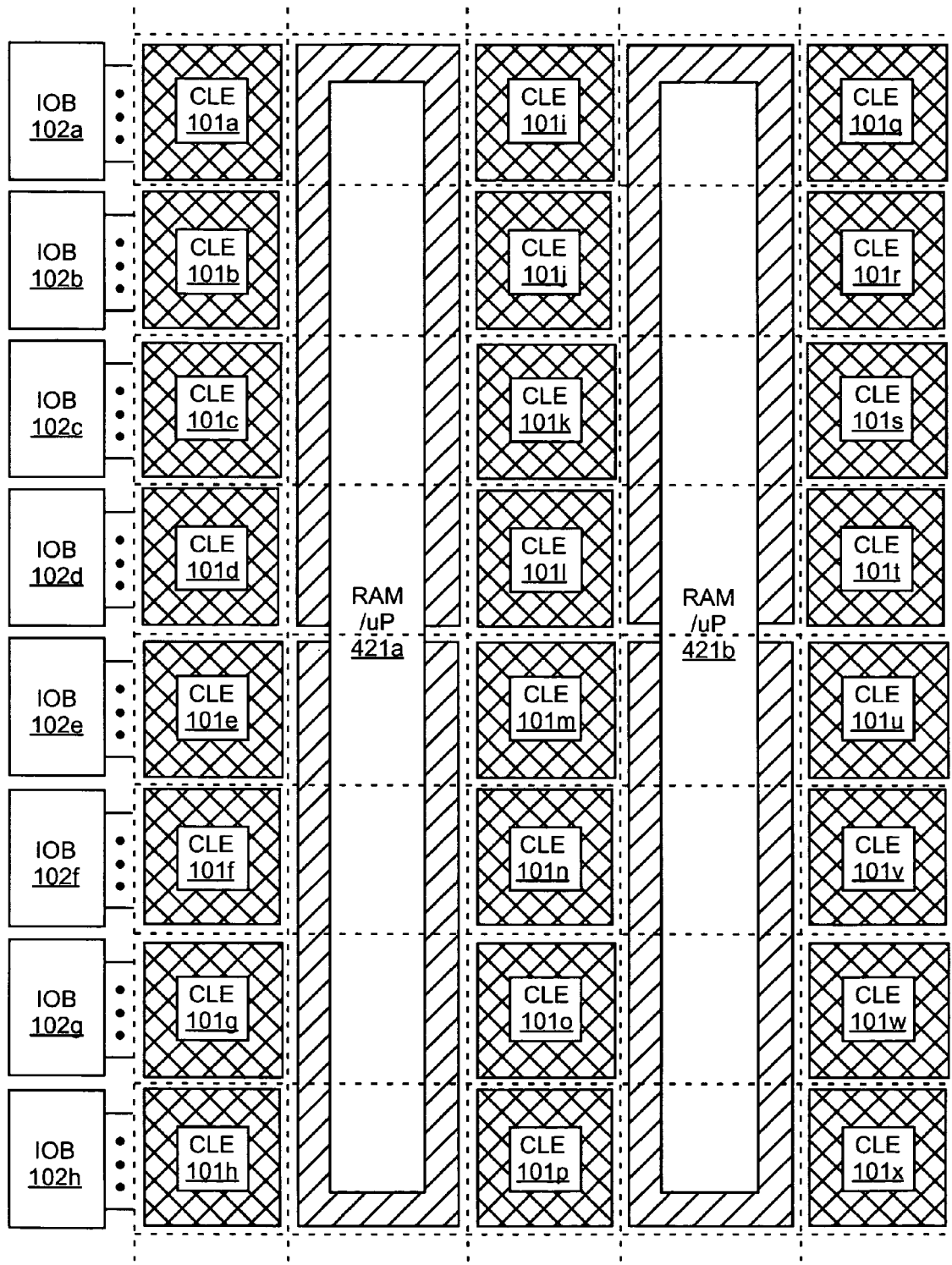
FIG. 4 is a block diagram of a second FPGA incorporating specialized blocks that offer both processor and RAM capabilities, according to another embodiment of the invention.

Note that the embodiment of FIG. 3 is superficially similar to the FPGA shown in FIG. 1. However, each BRAM block in FIG. 1 has been replaced by a specialized logic block offering both processor and RAM capabilities. FIG. 4 illustrates another embodiment of the invention, where the RAMs are paired together, with a single processor provided for each pair of RAMs. Thus, in the embodiment of FIG. 4 two BRAM blocks have been replaced by a specialized logic block including two RAM blocks, one processor, and a dedicated interface. In other embodiments, larger numbers of RAMs are grouped together with a single tightly-coupled processor.

In addition to higher operating frequencies, another advantage of the approach illustrated in FIGS. 3 and 4 is area efficiency. For example, processor/RAM blocks 421 in FIG. 4 each include two of the RAM blocks 103 from FIG. 1. Each of blocks 421 is the same height as the corresponding two BRAM blocks in FIG. 1, and only slightly wider. Note that the addition of extra rows of tiles to accommodate the processor, as pictured in FIG. 2, is unnecessary.

In one embodiment, it was found that the addition of a 16-bit processor and dedicated interface to two BRAM blocks required an increase of less than ten percent in the width of the block, with no change in height. Because the BRAM blocks are only a portion of the total chip area, the overall increase in the size of the PLD was only about one percent. This area efficiency is primarily a result of the fact that the largest portion of the area in each block is consumed by programmable routing. Adding a processor to a set of one or two (or more) BRAM blocks does not add to this programmable routing. In fact, the programmable routing already provided in the BRAM block is preferably retained with little or no alteration, thereby minimizing the effect of the substitution on the PLD routing software.

Figure 5:
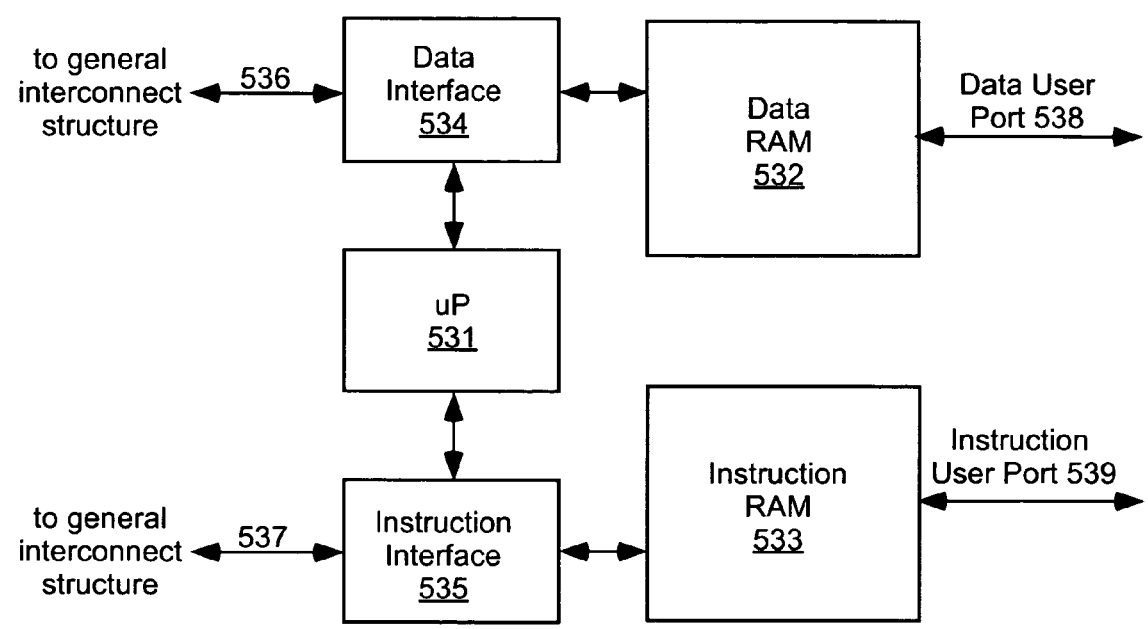
FIG. 5 is a block diagram of a specialized logic block for a PLD that offers both processor and RAM capabilities, according to one embodiment of the invention.

FIG. 5 is a block diagram of a first specialized logic block according to one embodiment of the invention. The specialized logic block of FIG. 5 includes a processor block 531, which can be any desired processor. For example, in one embodiment, processor 531 is a hard-coded 16-bit version of the MicroBlaze™ processor from Xilinx, Inc. In another embodiment, processor 531 is a hard-coded 32-bit version of the MicroBlaze processor. In yet another embodiment, processor 531 is an implementation of the IBM® PowerPC® 405D5 processor. ("IBM" and "PowerPC" are registered trademarks of International Business Machines Corporation.) In other embodiments, other processors and/or other bit widths are used.

The specialized logic block of FIG. 5 also includes two RAMs 532, 533. These two RAMs can be, for example, the same as RAMs 103a and 103b, or RAMs 103c and 103d, in FIG. 1. In the pictured embodiment, RAM 532 is used to store data for the processor and RAM 533 is used to store instructions for the processor. In the pictured embodiment, the dedicated interface is implemented as a pair of interfaces, a data interface 534 coupled between processor 531 and data RAM 532, and an instruction interface 535 coupled between processor 531 and instruction RAM 533. Each interface 534, 535 is also coupled to the general interconnect structure of the FPGA.

In the embodiment of FIG. 5, RAMs 532, 533 are both dual-port RAMs. For example, they can be the same as the RAMs used in implementing block RAMs in the Virtex-II and Virtex-II Pro FPGAs. When a dual-port RAM is used, one port is coupled directly to the corresponding interface 534, 535 ("coupled directly", i.e., without passing through the general interconnect structure of the FPGA). The other port of each RAM is coupled to the general interconnect structure and provides user-controlled access to the data and instructions stored in RAMs 532, 533.

Figure 6:
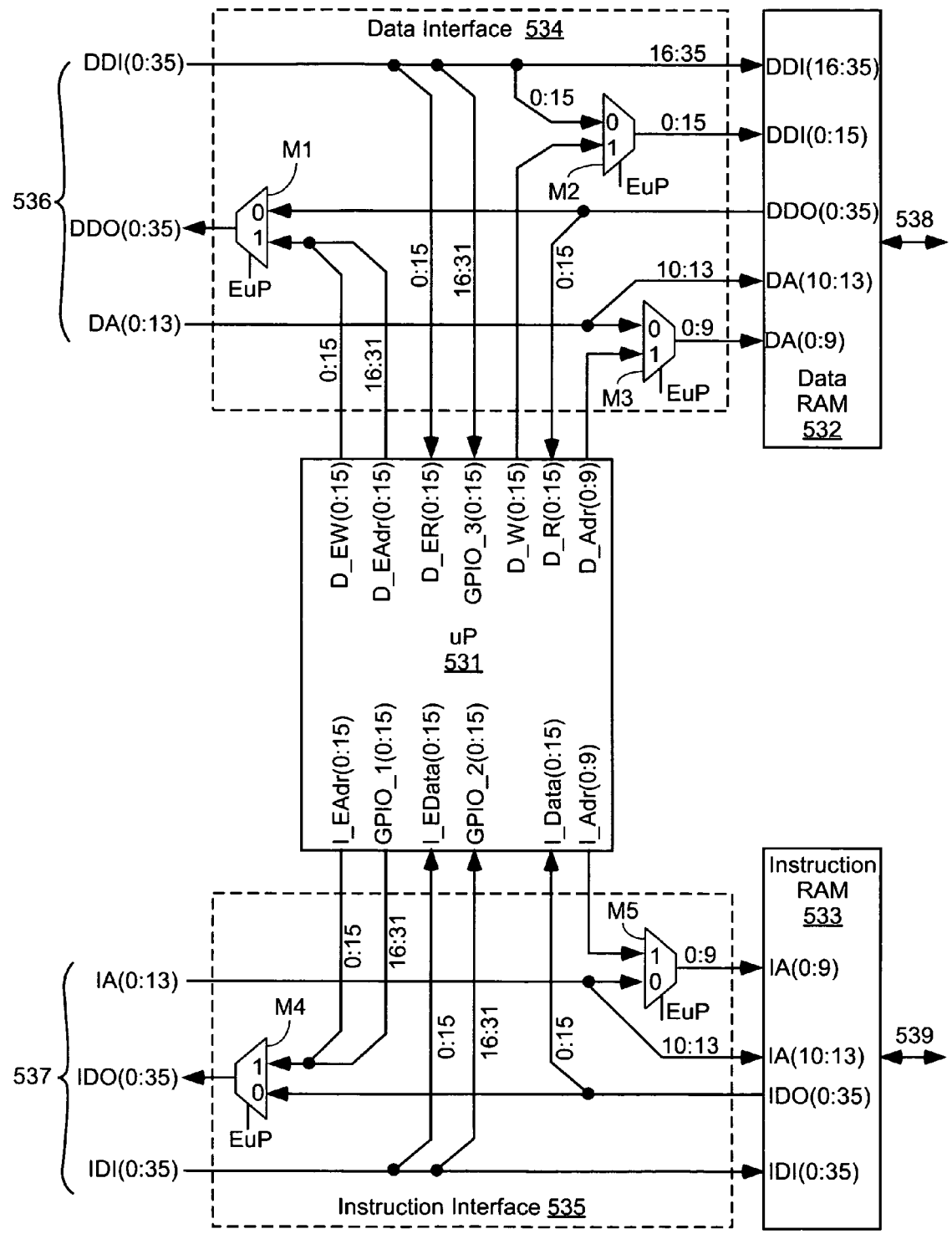
FIG. 6 is a schematic diagram of a specialized logic block offering both processor and RAM capabilities, according to one embodiment of the invention.

A desirable feature of some embodiments is the ability to bypass the processor and communicate directly with the RAM. In effect, the processor is disabled and removed from the circuit. FIG. 6 shows a schematic diagram for one embodiment of the specialized logic block of FIG. 5 having this capability. An enable signal EuP ("enable processor") has either a high or a low value. As illustrated, a low value on the EuP signal couples each RAM block to the general interconnect structure of the FPGA, bypassing the processor. Thus, when the EuP signal is low, the processor is effectively disabled. A high value on the EuP signal couples each RAM block to the processor, and further couples the processor to the general interconnect structure of the FPGA. Thus, when the EuP signal is high, the processor is effectively enabled. A similar embodiment (not shown) uses an active-low enable signal.

In some embodiments, the EuP signal is stored in a configuration memory cell of the FPGA. In other embodiments, the EuP signal is a dynamic signal supplied from elsewhere on the FPGA.

In the embodiment of FIG. 6, processor 531 is a 16-bit version of the MicroBlaze processor from Xilinx, Inc. The input and output signals of processor 531 are shown in Table 1.

TABLE 1

| I_EAdr(0:15) | Extended Instruction Bus, Address |
| I_EData(0:15) | Extended Instruction Bus, Read Data |
| I_Adr(0:9) | Local Instruction Bus, Address |
| I_Data(0:15) | Local Instruction Bus, Read Data |
| GPIO_1(0:15) | General Purpose Outputs |
| GPIO_2(0:15) | General Purpose Inputs |
| D_EAdr(0:15) | Extended Data Bus, Address |
| D_EW(0:15) | Extended Data Bus, Write Data |
| D_ER(0:15) | Extended Data Bus, Read Data |
| D_Adr(0:9) | Local Data Bus, Address |
| D_W(0:15) | Local Data Bus, Write Data |
| D_R(0:15) | Local Data Bus, Read Data |
| GPIO_3(0:15) | General Purpose Inputs |

Data interface 534 has a 36-bit data input terminal (i.e., a set of 36 terminals) DDI(0:35) from the general interconnect structure of the FPGA. Twenty DDI(16:35) of the 36 signals DDI(0:35) are passed directly to data RAM 532 at all times. The other 16 bits DDI(0:15) of input data are provided to RAM 532 via multiplexer M2 either by the general interconnect structure or by processor 531, depending on the value of the processor enable signal EuP. Data interface 534 also has a 36-bit data output terminal DDO(0:35) to the general interconnect structure of the FPGA. The 36 data output signals DDO(0:35) are provided to the data output terminals via multiplexer M1 by either data RAM 532 or processor 531, depending on the value of the processor enable signal EuP. 16 bits DDO(0:15) of the data output from data RAM 532 are always provided to processor 531. Data interface 534 also has a 14-bit address input terminal DA(0:13) from the general interconnect structure of the FPGA, which provides addressing information for data RAM 532. Four DA(10:13) of the 14 signals DA(0:13) are passed directly to data RAM 532 at all times. The other ten bits DA(0:9) of address are provided to data RAM 532 via multiplexer M3 either by the general interconnect structure or by processor 531, depending on the value of the processor enable signal EuP.

Instruction interface 535 has a 36-bit data input terminal IDI(0:35) from the general interconnect structure of the FPGA. The 36 signals IDI(0:35) are passed directly to processor 531 and to instruction RAM 533 at all times. Instruction interface 535 also has a 36-bit data output terminal IDO(0:35) to the general interconnect structure of the FPGA. The 36 data output signals IDO(0:35) are provided to the data output terminal via multiplexer M4 by either instruction RAM 533 or processor 531, depending on the value of the processor enable signal EuP. 16 bits IDO(0:15) of the data output from instruction RAM 533 are always provided to processor 531. Instruction interface 535 also has a 14-bit address input terminal IA(0:13) from the general interconnect structure of the FPGA, which provides addressing information for instruction RAM 533. Four IA(10:13) of the 14 signals IA(0:13) are passed directly to instruction RAM 533 at all times. The other ten bits IA(0:9) of address are provided to instruction RAM 533 via multiplexer M5 either by the general interconnect structure or by processor 531, depending on the value of the processor enable signal EuP.

In another embodiment, processor 531 is a 32-bit version of the MicroBlaze processor from Xilinx, Inc. In one such embodiment, two RAM blocks are included in the specialized block, as shown in FIG. 6. In one such embodiment, the RAM blocks are twice the width of the RAM blocks used with the 16-bit processor. Another embodiment includes four RAM blocks of the same size as those used with the 16-bit processor. The 32-bit MicroBlaze processor and the input and output signals of the processor are described in detail in the "MicroBlaze Processor Reference Guide Embedded Development Kit EDK (v. 3.1.2 EA)", published Nov. 13, 2002 and available from Xilinx, Inc., which is hereby incorporated herein by reference. The "MicroBlaze Processor Reference Guide Embedded Development Kit EDK (v. 3.1.2 EA)" is also appended hereto as Appendix A.

Figure 7:
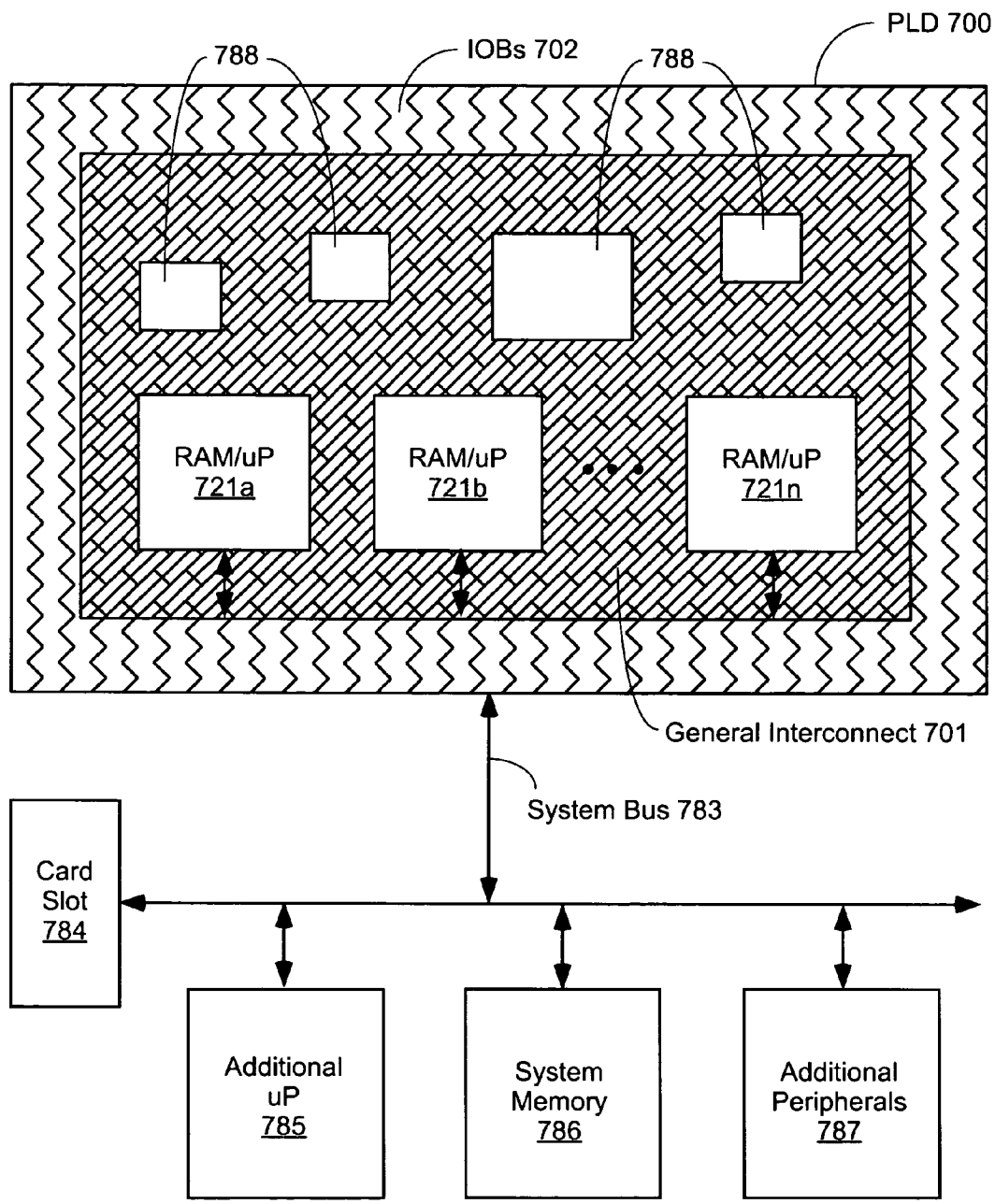
FIG. 7 is a block diagram of a system including a PLD incorporating specialized logic blocks according to one embodiment of the invention, in which the specialized logic blocks can be used for parallel processing.

FIG. 7 shows a system that includes a PLD including specialized logic blocks offering both processor and RAM capabilities. In this type of system, the specialized logic blocks can be used for parallel computing.

The system of FIG. 7 includes a system bus 783. System bus 783 can be any type of bus, for example, a PCI bus or a 60× bus such as that associated with the IBM PowerPC processor. Attached to the system bus can optionally be one or more devices communicating with the system bus, such as a card slot 784, an additional processor 785, system memory 786, or other peripherals 787. System bus 783 is also coupled to the IOBs 702 of PLD 700. Coupled to the IOBs 702, e.g., via the general interconnect structure 701, are two or more specialized logic blocks 721a–721n having both processor and RAM capabilities. The PLD also includes other logic blocks, some of which can have specialized functions.

Some advanced FPGAs, such as the Virtex-II Pro FPGAs, include several hundred BRAM blocks. If each of these BRAM blocks (or each pair or group of BRAM blocks) is replaced by a specialized block including both RAM and processor functions, highly parallel processing becomes available to the FPGA user. Because parallel processing can be much faster than using a single processor, an FPGA equipped in this fashion can perform some functions much faster than presently available FPGAs.

To implement parallel processing using a known FPGA, the design methodology currently requires that the parallel processors be coded into the circuit description, e.g., into the HDL (Hardware Description Language) code describing the circuit. A significant advantage of some embodiments of the invention is that if all BRAM blocks are replaced by specialized blocks including optional processors, compiler code can be developed that automatically takes advantage of these specialized blocks. For example, a design description can be written in "C" code, and a "C" compiler can be provided that automatically implements the code using the parallel processing capabilities of the FPGA.

Figure 8:
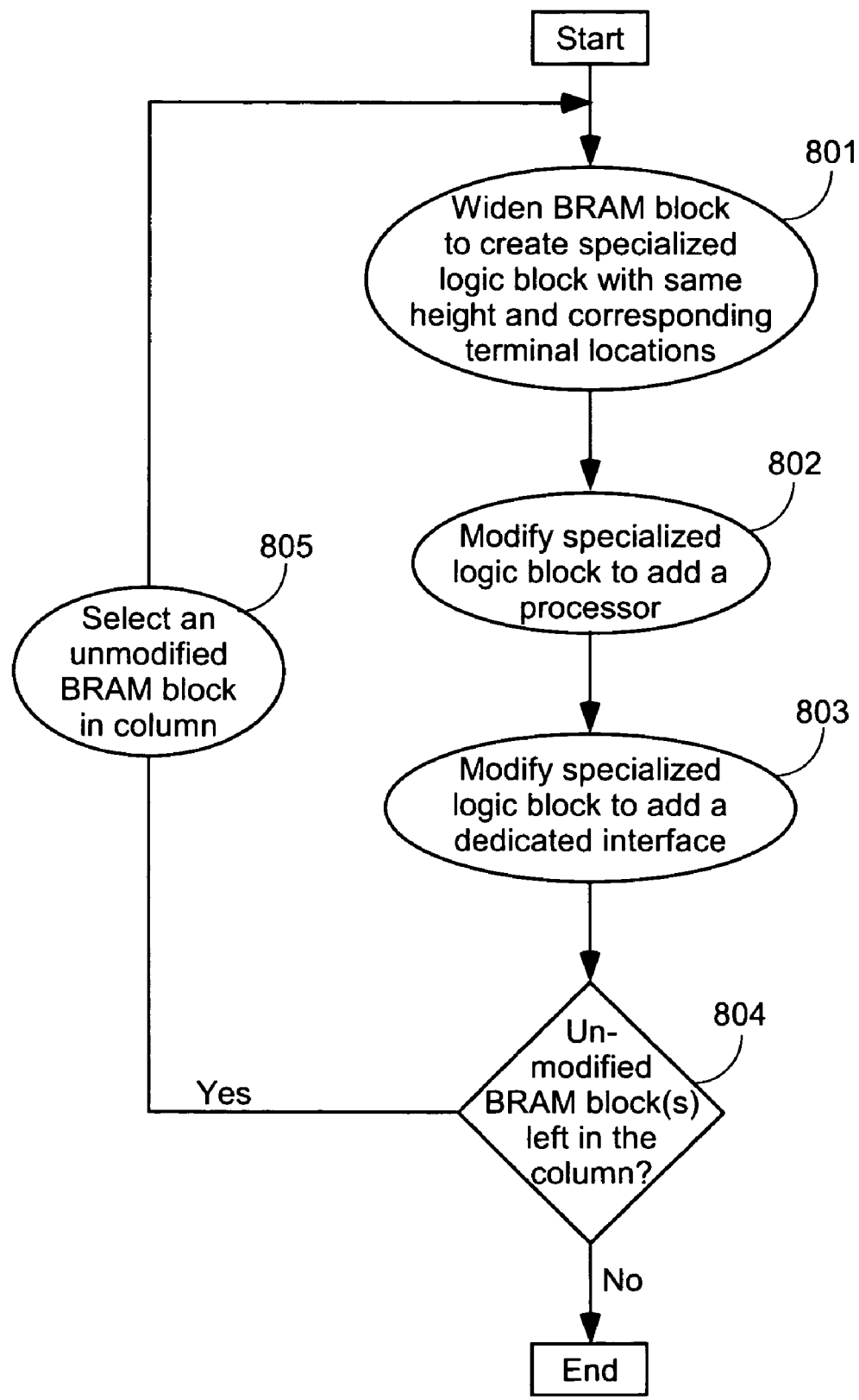
FIG. 8 shows the steps of a first method of modifying a PLD, according to one embodiment of the invention.

FIG. 8 illustrates the steps of one method of modifying a PLD according to one embodiment of the invention, e.g., to generate one of the PLDs shown and described above. The PLD includes columns of BRAM blocks and columns of programmable logic blocks programmably interconnected by a general interconnect structure. Each BRAM block includes a RAM and a plurality of terminals coupling the RAM to the general interconnect structure. Steps 801–803 are performed for each BRAM block in a column of BRAM blocks within the PLD. The method of FIG. 8 can be used, for example, to modify the PLD of FIG. 1 to generate a PLD such as that shown in FIG. 3.

In step 801, one of the BRAM blocks is widened to create a specialized logic block. The specialized logic block is wider than the BRAM block, but has the same height. The locations of the terminals leading to and from the block are retained in corresponding locations. For example, terminals along the left and right edges of the block are not moved vertically. Terminals along the top and bottom edges of the block can be spread apart, if desired, to accommodate the broader width of the specialized logic block. In some embodiments, the specialized logic block is less than ten percent wider than the BRAM block.

In step 802, the specialized logic block is modified to add a processor to the block. The processor can be, for example, one of the processors described above.

In step 803, the specialized logic block is modified to add a dedicated interface. The dedicated interface is coupled to the RAM (which is present as a result of being in the BRAM block) and to the processor, and further coupled to the general interconnect structure of the PLD through the terminals of the specialized logic block.

In some embodiments, the dedicated interface includes an enable terminal providing an enable signal, e.g., as in the specialized logic block shown in FIG. 5. When the enable signal is at a first logic level, the dedicated interface couples the RAM to the general interconnect structure while bypassing the processor. When the enable signal is at a second logic level, the dedicated interface coupled the RAM to the processor and the processor to the general interconnect structure.

In step 804, if there remains an unmodified BRAM block in the column, another of the BRAM blocks is selected (step 805) and modified following steps 801–803.

Figure 9:
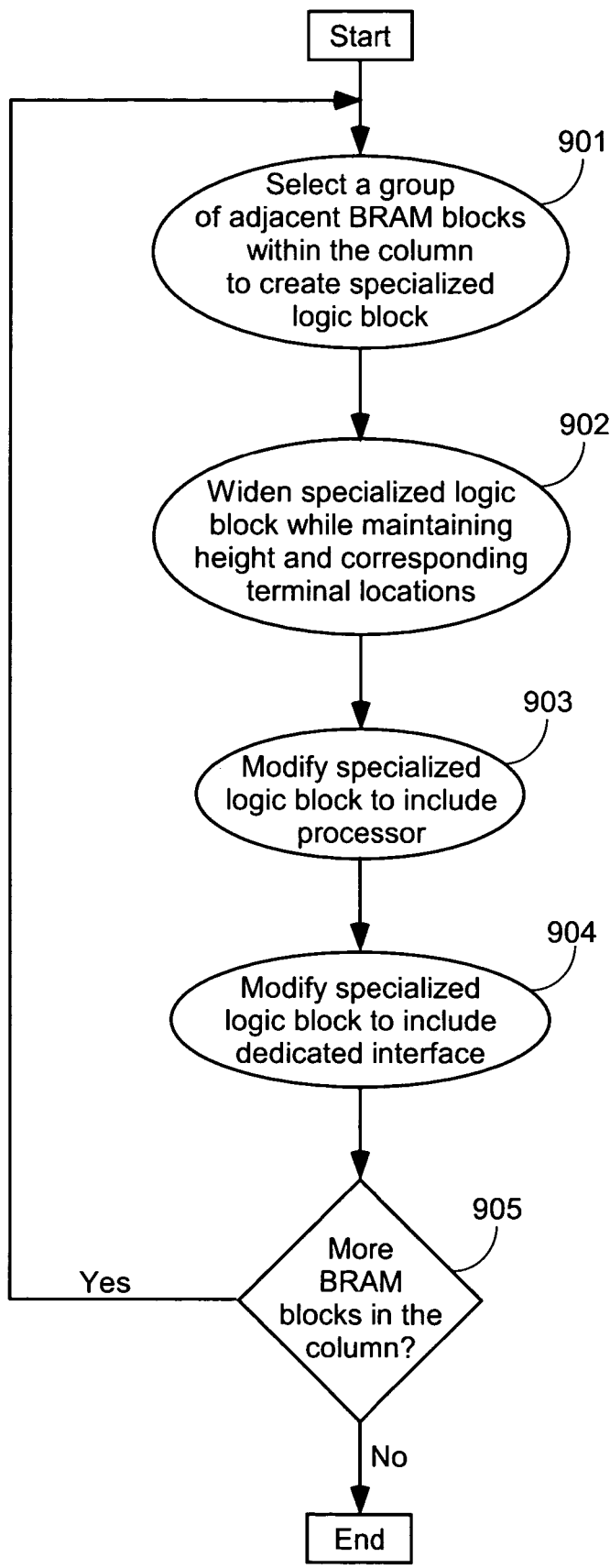
FIG. 9 shows the steps of a second method of modifying a PLD, according to another embodiment of the invention.

FIG. 9 illustrates the steps of another method of modifying a PLD according to one embodiment of the invention, e.g., to generate one of the PLDs shown and described above. The PLD includes columns of BRAM blocks and columns of programmable logic blocks programmably interconnected by a general interconnect structure. Each BRAM block includes a RAM and a plurality of terminals coupling the RAM to the general interconnect structure. Steps 901–904 are performed for each group of BRAM blocks in a column of BRAM blocks within the PLD. The method of FIG. 9 can be used, for example, to modify the PLD of FIG. 1 to generate a PLD such as that shown in FIG. 4.

In step 901, a group of adjacent BRAM blocks is selected from a column of BRAM blocks within the PLD. For example, the first N BRAM blocks at one end of the column can be selected, where N is a positive integer. In one embodiment, N is two. The group of adjacent BRAM blocks forms a new specialized logic block.

In step 902, the specialized logic block is widened, while maintaining the height of the block. The locations of the terminals leading to and from the block are retained in corresponding locations. For example, terminals along the left and right edges of the block are not moved vertically, while terminals along the top and bottom edges of the block can be spread apart, if desired, to accommodate the broader width of the specialized logic block.

In step 903, the specialized logic block is modified to add a processor to the block. The processor can be, for example, one of the processors described above.

In step 904, the specialized logic block is modified to add a dedicated interface. The dedicated interface is coupled to the RAMs (which are present as a result of being in the BRAM blocks) and to the processor, and further coupled to the general interconnect structure of the PLD through the terminals of the specialized logic block. In some embodiments, the dedicated interface includes an enable terminal, e.g., as in the specialized logic block shown in FIG. 5.

In step 905, if there remain unmodified groups of BRAM blocks in the column, steps 901–904 are repeated for each group.

Figure 10:
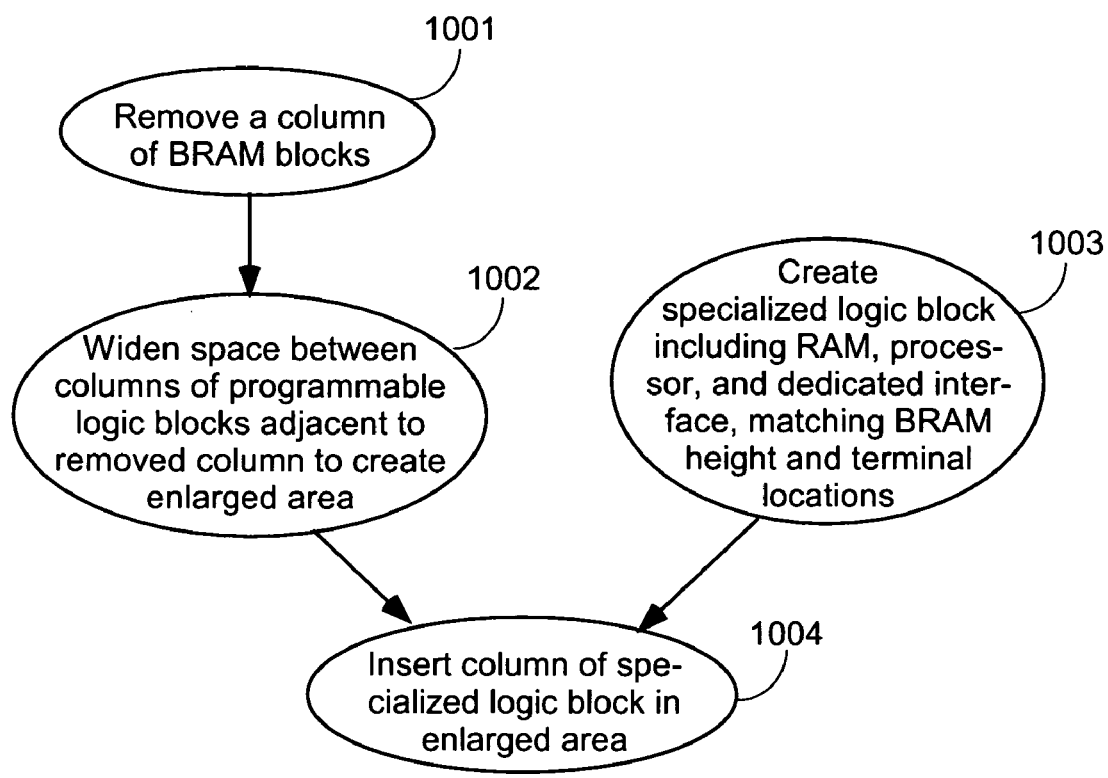
FIG. 10 shows the steps of a method of designing a new PLD based on an existing PLD architecture, according to another embodiment of the invention.

FIG. 10 illustrates the steps of a method of designing a new PLD based on an existing PLD architecture according to one embodiment of the invention, e.g., to generate one of the PLDs shown and described above. The existing PLD architecture includes columns of BRAM blocks included in an array comprising rows and columns of programmable logic blocks programmably interconnected by a general interconnect structure. The method of FIG. 10 can be used, for example, to modify the PLD of FIG. 1 to generate a PLD such as those shown in FIGS. 3 and 4.

In step 1001, a column of BRAM blocks is removed from the existing PLD architecture. In step 1002, the space between two columns of programmable logic blocks adjacent to the removed column is widened to created an enlarged area.

In step 1003, which can occur in any order relative to steps 1001 and 1002, a specialized logic block is created. The specialized logic block includes a first RAM, a processor, a plurality of terminals, and a dedicated interface. The dedicated interface is coupled to the first RAM and to the processor, and is further coupled to the general interconnect structure via the terminals of the specialized logic block.

The height of the specialized logic block is the same as that of a first group of removed BRAM blocks. The terminals of the specialized logic block also have corresponding locations to corresponding terminals in the first group of removed BRAM blocks. For example, terminals along the left and right edges of the block are not moved vertically. However, terminals along the top and bottom edges of the block can be spread apart, if desired, to accommodate the broader width of the specialized logic block.

In step 1004, a column of the specialized logic blocks is inserted in the enlarged area resulting from step 1002. Because the terminal locations of the new column of specialized logic blocks correspond to those of the removed column of BRAM blocks, changes to other portions of the PLD are minimized. Because the architecture of the general interconnect structure was not changed, changes to the PLD routing software are also minimized or rendered unnecessary.

Those having skill in the relevant arts of the invention will now perceive various modifications and additions that can be made as a result of the disclosure herein. For example, systems, PLDs, FPGAs, BRAM blocks, specialized logic blocks, programmable logic blocks, RAMS, processors, dedicated interfaces, multiplexers, CLEs, CLBs, IOBs, and other components other than those described herein can be used to implement the invention. Active-high signals can be replaced with active-low signals by making straightforward alterations to the circuitry, such as are well known in the art of circuit design.

Moreover, some components are shown directly connected to one another while others are shown connected via intermediate components. In each instance, the method of interconnection establishes some desired electrical communication between two or more circuit nodes. Such communication can often be accomplished using a number of circuit configurations, as will be understood by those of skill in the art.

Accordingly, all such modifications and additions are deemed to be within the scope of the invention, which is to be limited only by the appended claims and their equivalents.

What is claimed is:

1. A method of modifying a programmable logic device (PLD) including columns of block random access memory (BRAM) blocks and columns of programmable logic blocks programmably interconnected by a general interconnect structure, each BRAM block including a RAM and a plurality of terminals coupling the RAM to the general interconnect structure, the method comprising, for each BRAM block in a first column of BRAM blocks:
widening the BRAM block to create a specialized logic block wider but having the same height as the BRAM block, wherein the terminals of the specialized logic block have corresponding locations to the terminals of the BRAM block;
modifying the specialized logic block to include a processor; and
modifying the specialized logic block to include a dedicated interface coupled to the RAM from the BRAM block and to the processor, and further coupled to the general interconnect structure via the terminals of the specialized logic block.

2. The method of claim 1, wherein the specialized logic block has a width that is between one and two times the width of the BRAM block.

3. The method of claim 1, wherein:
modifying the specialized logic block to include a dedicated interface comprises adding a dedicated interface comprising an enable terminal providing an enable signal;
when the enable signal is at a first logic level, the dedicated interface couples the RAM to the general interconnect structure while bypassing the processor; and
when the enable signal is at a second logic level, the dedicated interface couples the RAM to the processor, and further couples the processor to the general interconnect structure.

4. The method of claim 3, further comprising adding a configuration memory cell coupled to the enable terminal of the dedicated interface.

5. The method of claim 1, wherein:
modifying the specialized logic block to include a dedicated interface comprises adding a dedicated interface designed to operate at a frequency the same as an operating frequency of the processor.

6. The method of claim 1, wherein:
modifying the specialized logic block to include a processor comprises adding a 16-bit processor.

7. The method of claim 1, wherein:
modifying the specialized logic block to include a processor comprises adding a 32-bit processor.

8. The method of claim 1, wherein:
modifying the specialized logic block to include a processor comprises adding a RISC processor.

9. The method of claim 1, wherein the PLD is a Field Programmable Gate Array (FPGA).

10. A method of modifying a programmable logic device (PLD) including columns of block random access memory (BRAM) blocks and columns of programmable logic blocks programmably interconnected by a general interconnect structure, each BRAM block including a RAM and a plurality of terminals coupling the RAM to the general interconnect structure, the method comprising, for each group of adjacent BRAM blocks within a column:
selecting a first group of adjacent BRAM blocks within the column to create a specialized logic block;
widening the specialized logic block to be wider but to have the same height as the first group of adjacent BRAM blocks, wherein the terminals of the specialized logic block have corresponding locations to the terminals of the first group of BRAM blocks;
modifying the specialized logic block to include a processor; and
modifying the specialized logic block to include a dedicated interface coupled to the RAMs from each of the first group of BRAM blocks and to the processor, and further coupled to the general interconnect structure via the terminals of the specialized logic block.

11. The method of claim 10, wherein the specialized logic block has a width that is between one and two times the width of the BRAM blocks.

12. The method of claim 10, wherein:
selecting a first group of adjacent BRAM blocks within the column comprises selecting first and second BRAM blocks, the first RAM storing data for the processor and the second RAM storing instructions for the processor; and
modifying the specialized logic block to include a dedicated interface comprises adding a data interface coupled to the first RAM and an instruction interface coupled to the second RAM.

13. The method of claim 10, wherein:
modifying the specialized logic block to include a dedicated interface comprises adding a dedicated interface comprising an enable terminal providing an enable signal;
when the enable signal is at a first logic level, the dedicated interface couples each of the RAMs to the general interconnect structure while bypassing the processor; and
when the enable signal is at a second logic level, the dedicated interface couples each of the RAMs to the processor, and further couples the processor to the general interconnect structure.

14. The method of claim 13, wherein modifying the specialized logic block to include a dedicated interface further comprises adding a configuration memory cell coupled to the enable terminal of the dedicated interface.

15. The method of claim 10, wherein:
modifying the specialized logic block to include a dedicated interface comprises adding a dedicated interface designed to operate at a frequency the same as an operating frequency of the processor.

16. The method of claim 10, wherein:
modifying the specialized logic block to include a processor comprises adding a 16-bit processor.

17. The method of claim 10, wherein:
modifying the specialized logic block to include a processor comprises adding a 32-bit processor.

18. The method of claim 10, wherein:
modifying the specialized logic block to include a processor comprises adding a RISC processor.

19. The method of claim 10, wherein the PLD is a Field Programmable Gate Array (FPGA).

20. A method of designing a new programmable logic device (PLD) based on an existing PLD architecture, the existing PLD architecture including columns of block random access memory (BRAM) blocks included in an array comprising rows and columns of programmable logic blocks programmably interconnected by a general interconnect structure, the method comprising:

removing a column of the BRAM blocks;

widening a space between two columns of programmable logic blocks adjacent to the removed column of BRAM blocks to create an enlarged area;

creating a specialized logic block including a first random access memory (RAM), a processor, a plurality of terminals, and a dedicated interface coupled between the first RAM and the processor and further coupled to the general interconnect structure of the new PLD via the plurality of terminals, each specialized logic block having a height equal to a height of a first group of removed BRAM blocks, the plurality of terminals having corresponding locations to corresponding terminals in the first group of removed BRAM blocks; and inserting in the enlarged area a column of the specialized logic blocks.

21. The method of claim 20, wherein the enlarged area and the specialized logic block each have a width that is between one and two times the width of the removed BRAM blocks.

22. The method of claim 20, wherein:

the first group of removed BRAM blocks includes two BRAM blocks;

the first RAM stores data for the processor;

each specialized logic block further includes a second RAM storing instructions for the processor; and the dedicated interface in each specialized logic block comprises a data interface coupled to the first RAM and an instruction interface coupled to the second RAM.

23. The method of claim 20, wherein:

the dedicated interface in each specialized logic block comprises an enable terminal providing an enable signal;

when the enable signal is at a first logic level, the dedicated interface couples each of the RAMs to the general interconnect structure while bypassing the processor; and when the enable signal is at a second logic level, the dedicated interface couples each of the RAMs to the processor, and further couples the processor to the general interconnect structure.

24. The method of claim 23, wherein the dedicated interface in each specialized logic block further comprises a configuration memory cell coupled to the enable terminal of the dedicated interface.

25. The method of claim 20, wherein the dedicated interface in each specialized logic block is designed to operate at a frequency the same as an operating frequency of the processor.

26. The method of claim 20, wherein the processor in each specialized logic block comprises a 16-bit processor.

27. The method of claim 20, wherein the processor in each specialized logic block comprises a 32-bit processor.

28. The method of claim 20, wherein the processor in each specialized logic block comprises a RISC processor.

29. The method of claim 20, wherein the existing PLD architecture is a Field Programmable Gate Array (FPGA) architecture, and the new PLD is an FPGA.

* * * * *